INVENTOR.
WILLIAM LEONARD FULTON
BY
OSTROLENK, FABER, GERB & SOFFEN
ATTORNEYS

GEORGE J. SHOMPHE

INVENTOR

BY [signature]

INVENTOR.
WILLIAM LEONARD FULTON
BY
OSTROLENK, FABER, GERB & SOFFEN
ATTORNEYS

INVENTOR.
WILLIAM LEONARD FULTON
BY
OSTROLENK, FABER, GERB & SOFFEN
ATTORNEYS

April 26, 1966 W. L. FULTON 3,248,674

FINE TUNING DRIVE WHICH CLUTCHES AUTOMATICALLY ON SLIGHT TURNING OF VERNIER KNOB AND DECLUTCHES AUTOMATICALLY ON EXCESSIVE TURNING

Original Filed June 27, 1961 5 Sheets-Sheet 5

INVENTOR.
WILLIAM LEONARD FULTON

BY

OSTROLENK, FABER, GERB & SOFFEN

ATTORNEYS

United States Patent Office 3,248,674
Patented Apr. 26, 1966

3,248,674
FINE TUNING DRIVE WHICH CLUTCHES AUTOMATICALLY ON SLIGHT TURNING OF VERNIER KNOB AND DECLUTCHES AUTOMATICALLY ON EXCESSIVE TURNING

William Leonard Fulton, Roselle, Ill., assignor to Standard Kollsman Industries Inc., Melrose Park, Ill., a corporation of Illinois Continuation of abandoned application Ser. No. 119,877, June 27, 1961. This application Oct. 2, 1964, Ser. No. 403,690
3 Claims. (Cl. 334—51)

This invention relates to novel fine tuning mechanisms, particularly for television tuners, of effective, simplified and economical construction; and is a continuation of my U.S. Patent application Serial No. 119,877, filed June 27, 1961, for "Fine Tuning Mechanism," now abandoned.

The band-width of television channels is six megacycles. There are twelve VHF channels, which generally are tuned-in through individual or discrete steps. The common circuit sections of the tuner are thereby altered to tune to the desired channel frequency band. As the requisite oscillator frequencies for the signal heterodyning should be close to predetermined values, a common manual fine tuning element has generally been provided for this purpose. However, whenever such element is adjusted for one channel, its upsets the setting for the others.

Recently, relatively complex twelve-position camming devices have been introduced to avoid such resettings, utilizing individual presettable fine tuning cams for the channel selection positions of the tuner. Their utility has been particularly indicated in motorized remote tuning television receivers. Permitting individual channel fine tuning through external adjustment by a single knob, troublesome retuning of the other channels was avoided. However, the added weight, cost, space, and mechanical vulnerability of such devices have limited their general use in television receivers.

In accordance with the present invention, a single control pinion is operated through the external fine tuning knob, to selectively operate the oscillator coil slugs directly for all the television channels. The control pinion is rotatable in either direction, to effect fine longitudinal adjustments on any engaged slug, and thereby precisely tune the circuit for the selected channel. Upon manual release of the knob, internal resilient biasing of the invention mechanism directly disengages the control pinion. The oscillator slugs are thus retained in their individual settings, for normal tuning-in operations by the tuner. Should any channel later require retuning its presettable slug is directly reset simply by turning the fine tuning knob. Visual observation of this operation is available on the screen, as precise tuning presetting occurs with best picture reception.

The invention preset fine tuning mechanism is simple in construction, contains relatively few parts, and is rugged. Its compactness and enocomy make it practical for general television use. The preferred application is to directly control any of the oscillator coil slugs of the tuner, and thus eliminate the need for a common fine tuning impedance as heretofore employed. The oscillator slugs hereof are in the form of threaded metal members or screws. Each slug has a transverse head formed as a gear and engageable with the control pinion. The slug head gears are moved to be out of engagement with the pinion, at either end of their stroke.

It is accordingly a primary object of the present invention to provide novel fine-tuning mechanism, individually presettable in tuners with discretely tuned television channels.

Another object of this invention is to provide novel presettable fine tuning mechanism of simplified and rugged construction.

A further object of this invention is to provide novel presettable fine tuning mechanism of direct and precise operation; and directly disengaged when the external knob is released through internal biasing.

Still another object of this invention is to provide novel presettable fine tuning mechanism that inherently avoids damage to the oscillator slugs, or freezing of the mechanism at the end positions of the slugs.

These and other objects of this invention will become more apparent from the following description of an exemplary embodiment thereof, illustrated in the drawings, in which.

Figure 1:
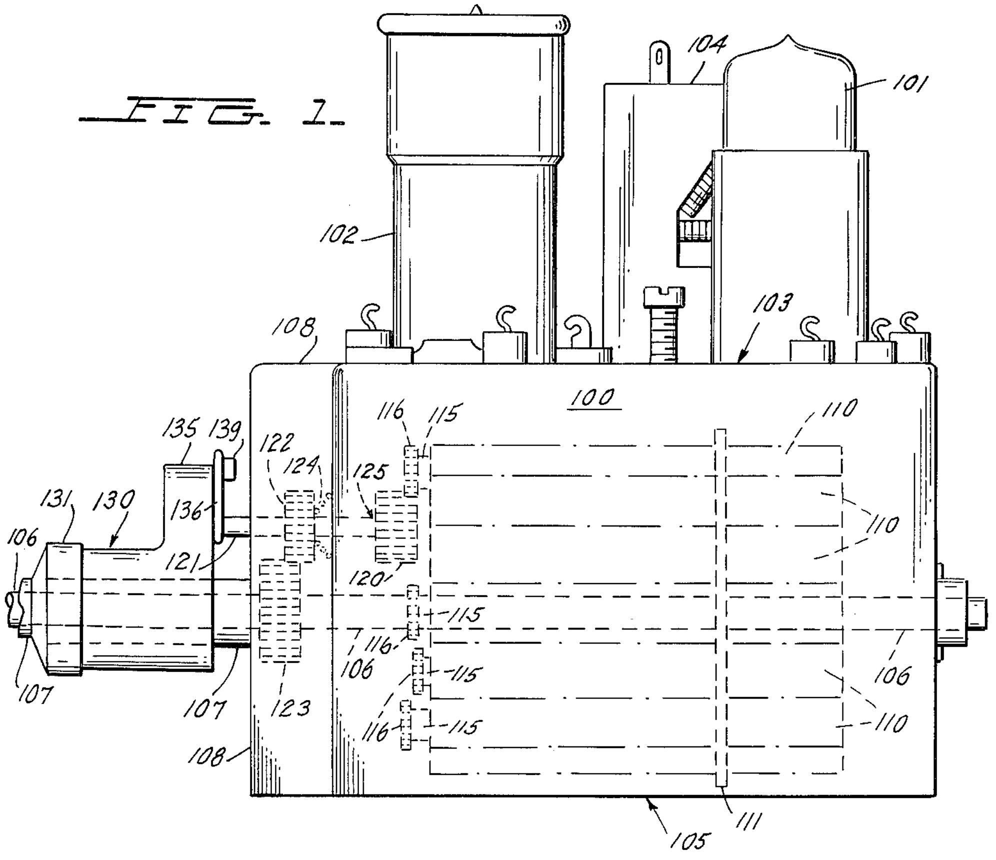
FIG. 1 is a side elevational view of a tuner, embodying a form of this invention.
Figure 2:
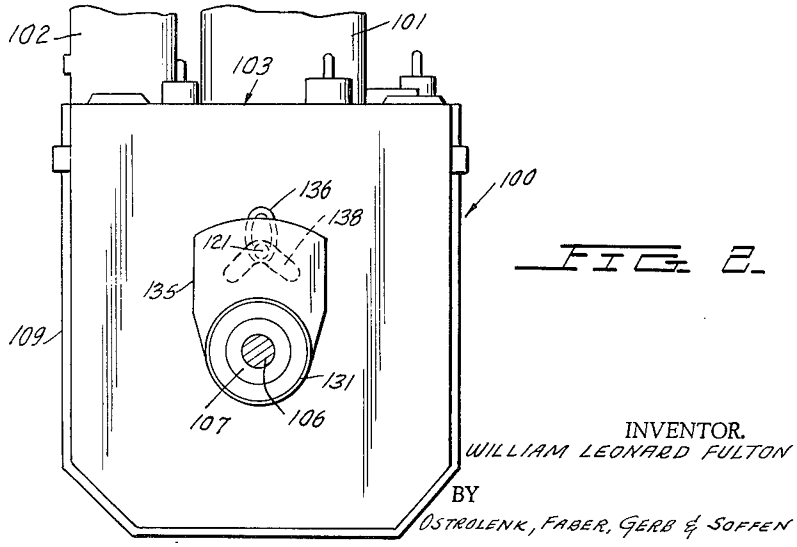
FIG. 2 is an end elevational view of the FIG. 1 tuner, showing the exterior preset mechanism portion in face view.
Figure 3:
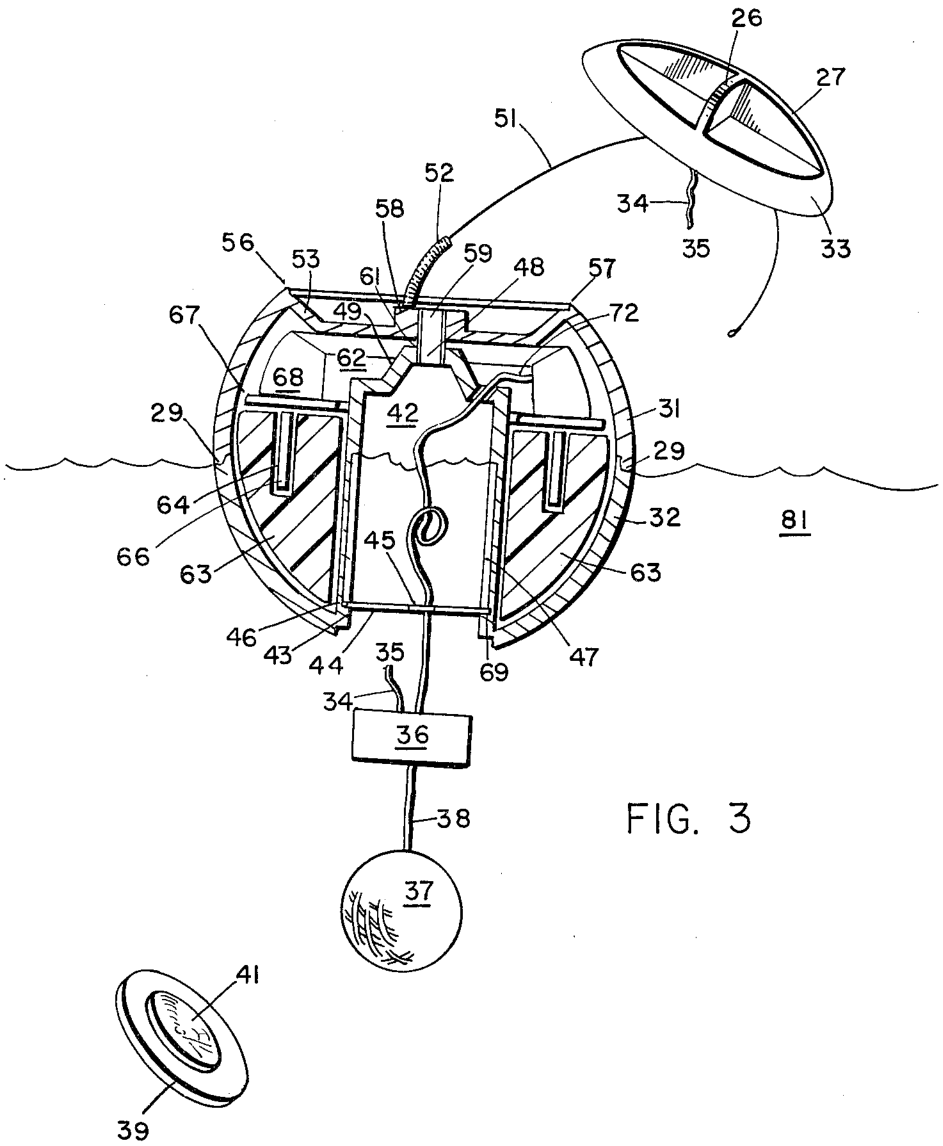
FIG. 3 is an enlarged cross-sectional view, longitudinally through the preset mechanism of FIG. 1 when in its neutral position.

FIGS. 4 and 5 are respective cross-sectional views through the cam section of the FIG. 3 mechanism, taken along the lines 14—14 and 15—15 thereof.

Figure 6:
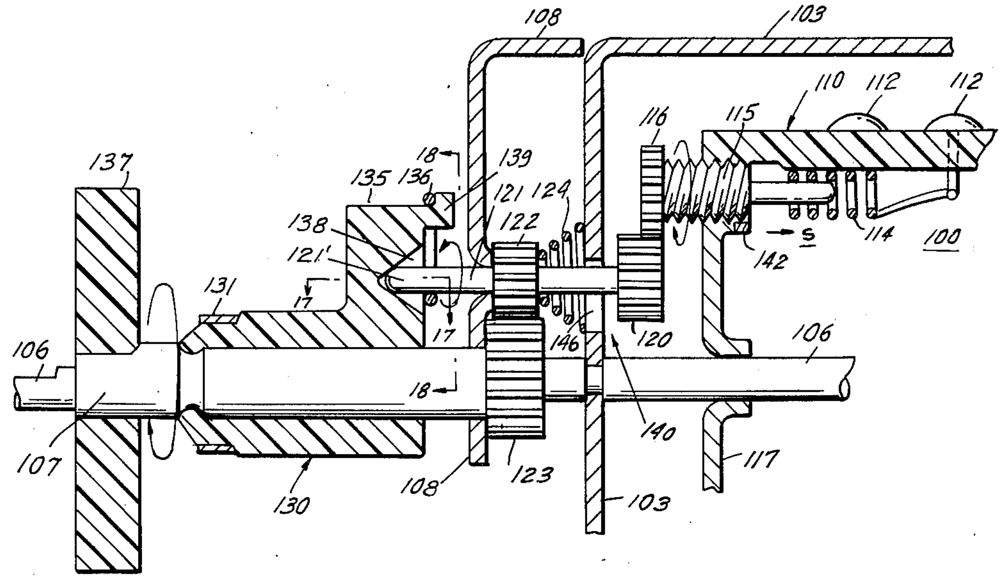

FIG. 6 is a cross-sectional view of the preset mechanism corresponding to FIG. 3 when in the clockwise knob fine tuning mode.

Figure 7:
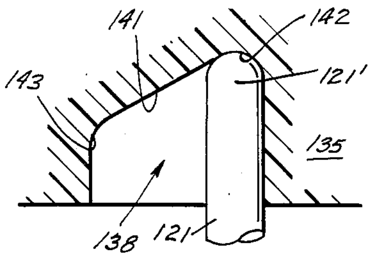
Figure 8:
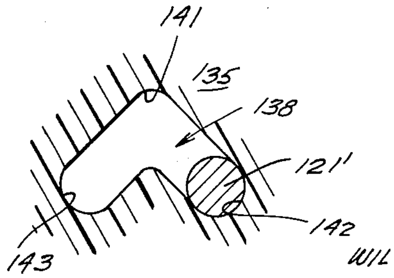

FIGS. 7 and 8 are respective enlarged cross-sectional and face views of the cam section of FIG. 6 taken along lines 17—17 and 18—18 thereof.

Figure 9:
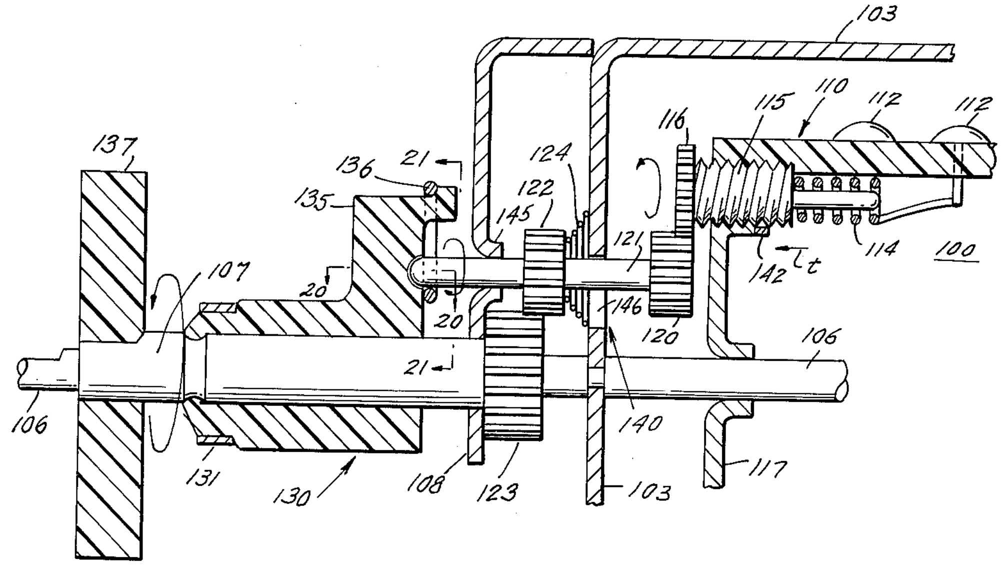

FIG. 9 is a cross-sectional view of the preset mechanism corresponding to FIG. 3, when in the counterclockwise knob fine tuning mode.

Figure 10:
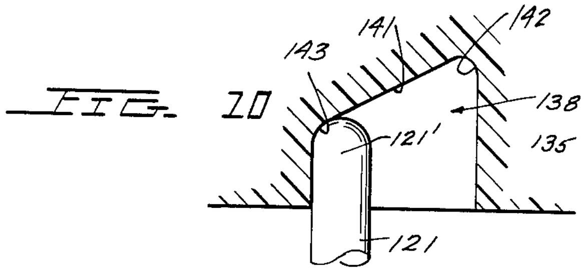
Figure 11:
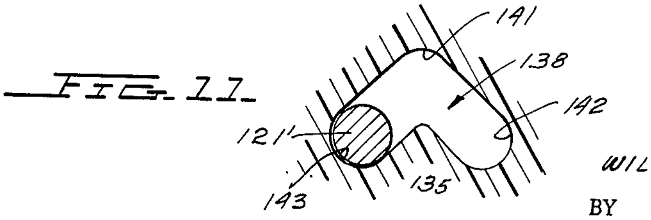

FIGS. 10 and 11 are respective enlarged cross-sectional and face views of the cam section of FIG. 9, taken along the lines 14—14 and 15—15 thereof.

Figure 12:
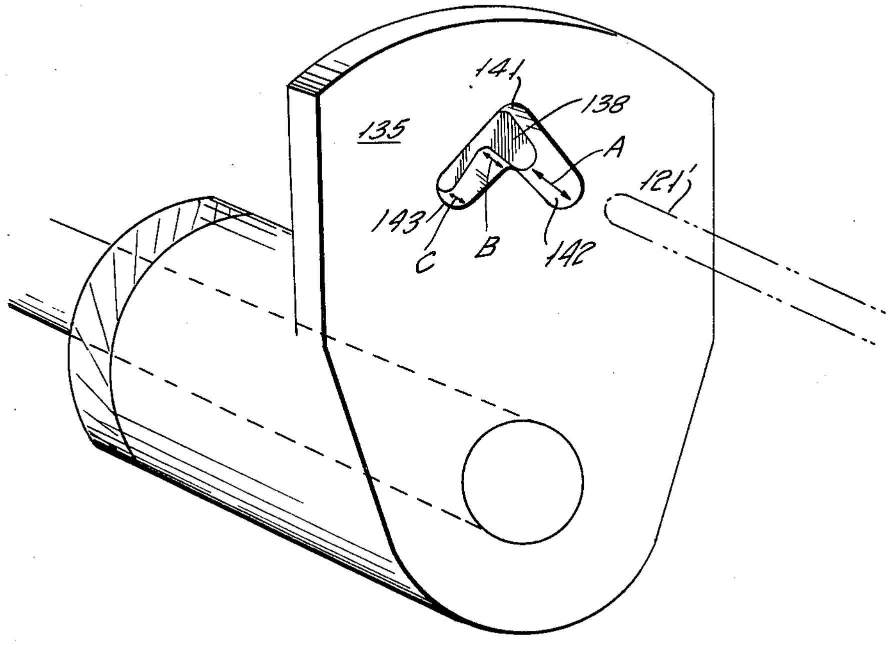

FIG. 12 is a perspective view of the actuating cam member.

The VHF television tuner, illustrated in FIGS. 1–11, embodies a preferred form of the present invention for selectively presetting the oscillator slugs by external manual operation of the fine tuning shaft. Tuner 100 utilizes typical RF circuitry including an RF amplifier tube 101 and oscillator-mixer tube at 102. A box-like metal chassis 103 encloses and shields a rotatable turret or drum 105 manually operated by selector control shaft 106. An antenna input network board 104 connects to the antenna lead-in. A separable front cover 108, and side-bottom cover 109, complete the overall shielding and protection of internal parts.

The drum 105 is composed of individual panels 110 longitudinaly arranged across mounting discs, in a suitable conventional manner. A central disc 111 is advantageously used, as both a circuit shield and detent plate in the manner of U.S. Patent 2,496,183 which issued on January 31, 1950 and assigned to the same assignee. Each panel 110 contains circuit elements, as coils, that are selectively connected into the fixed tuner circuitry through contacts 112, 112 (FIG. 3) on the panels, in the well known manner.

The oscillator coil (114) at the left end of each panel 110 (see FIG. 3) has a metallic slug 115 suitably threaded into the end of the panel (110) body, and is longitudinally displaceable in the coil 114 for presetting its circuit frequency. Each slug 115 contains a transverse headgear 116 at its exterior end. The control pinion 120 is engaged with a positioned slug gear 116 through turning of fine tune hollow shaft 107 in either the C.W. or C.C.W. direction. The pinion shaft 121 contains driven gear 122 which is engaged with drive gear 123; schematically represented in dotted lines in FIG. 1.

A biasing spring 124 presses against gear 122 and moves the pinion-drive gear assembly 124, so that pinion 120 becomes disengaged from the slug gears 116 upon release of shaft 107, for the neutral mode. The slip-clutch-cam assembly 130 is pressed onto fine tune shaft 107 by a metal band 131. Its cam section 135 extends transversely outwardly and coacts with pinion shaft 121. Shaft 121 is held in coaction with cam 135 by a C spring 136, as will be set forth hereinafter. The coacting shaft end engages a hollowed-out cam 138 in cam section 135, indicated in dotted lines in FIG. 2.

FIG. 3 shows the preset fine tune mechanism 140 for the tuner 100 in its neutral mode, which occurs while the fine tune knob 137 on shaft 107 is released. The C spring 136 is hooked onto a projection 139 of cam body 135, and about the end 121' of control shaft 121 at cam 138. Spring 136 thereupon tilts shaft 121, with gear 122 pivoting on drive gear 123, thereby disengaging control pinion 120 from slug gears 116. The cam follower end 121' of control shaft 121 is forced against the apex 141 of the inverted V cam 138 surface of the clutch-cam member 130; see FIGS. 4 and 5. Such angular displacement of control pinion shaft 121 is a mechanically positive action in the control mechanism 140 hereof.

Further, the biasing spiral spring 124 presses against gear 122, and maintains shaft end 121' stably in cam 138 during the neutral mode. The slug 115 of the positioned panel 110 retains its longitudinal position last longitudinally preset with respect to its oscillator coil 114. A flat retaining spring 144 holds the slug 115 firmly in its preset positions in the dielectric panel 110. The oscillator end of panel 110 is suitably held in end mounting disc 117 of the drum 105. While individual removal panels (110) are used in tuner 100, it is to be understood that the preset mechanism 140 may be used with non-removable circuit elements and slugs (115).

The control mechanism gears 120, 122 and 123 are desirably made of tough and resilient plastic material, as is member 130. The control shaft 121 is arranged to freely pivot, with its left bearing 145 in cover plate 108 and aperture 146 in chassis wall 103 being adapted for this purpose. During the tilting and displacement (to the left) of the control shaft 121 to the "neutral" position illustrated in FIG. 3, spur gears 122 and 123 remain engaged. The control operation modes of mechanism 140 retains such gear engagement for the slug 115 presetting actions, as will now be described.

The resilient plastic material of gears 122, 123 permits smooth transition among the three operational modes, despite their angular and longitudinal displacements. In practice, the angular tilt of gear 122, to keep control pinion 120 clear of the head-gears (116) in the neutral mode, need not be more than the order of 15°. The tilt angle for shaft 121 is predetermined by the height of apex 141 of the inverted V cam 138, shown in cross-sectional FIGS. 4 and 5.

FIG. 6 illustrates the control mode for preset mechanism 140 when fine tune knob 137 is rotated in the C.W. direction. Slip-clutch 130 is thereupon turned in the C.W. direction, with its cam 135 abutting cam follower end 121' of shaft 121, as shown in face view FIG. 8. The cam surface 138 thus presses follower 121' to cam control shaft 121 into the horizontal position, and control pinion 120 also engages the positioned slug-gear 116. The clutch member 130 then slips with respect to shaft 137 while the latter is continued in rotation. For this mode, the cam 138 is shaped deepest at region 142. Control shaft 121 is thus displaced to the left by compressed spiral spring 124 to fully seat into cam region 142.

The C.W. rotation of fine tune knob 137 causes drive gear 123 to rotate driven gear 122 in the C.C.W. direction. The control shaft 121 and control pinion therefore turn in unison with gear 122. The positioned slug-gear 116 is thus rotated C.W. while knob 137 is turned C.W., as indicated by the arrows, in FIG. 6. Slug 115 is arranged to move longitudinally inwards of panel 110 when rotated C.W., as arrow *s* shows. Continued rotation of control pinion 120 results in spur gear 116 "riding off" its edge, being the end of its inwardly stroke.

The displacement of pinion 120 to the left, through cam region 142, insures a safe clearance of pinion 120 with respect to such stroke limit of gears 116. This prevents overdrive and damage to the gears 116 and the control mechanism 140. Upon release of knob 137, C spring 136 automatically presses cam follower 121' into the cam apex 141, tilting control shaft 121 and pinion 120 clear of the gear (116) paths and to "neutral."

FIG. 9 illustrates the C.C.W. control mode of preset mechanism 140. When knob 137 is turned C.C.W., clutch-cam assembly 130 is initially rotated from neutral, until the cam follower tip 121' engages the shallowest edge 143 of the inverted V cam 138. The control shaft 121 is positioned horizontally in the same manner as in the C.W. mode described. However, shaft 121 is displaced to the right by shallower cam surface 143 as shown in enlarged detail in FIGS. 10 and 11, and denoted in FIG. 9. The pinion 120 thereupon engages the positioned slug gear 116 and turns it in the C.C.W. direction, as indicated by the arrows.

The C.C.W. rotation of gears 116 motivates them in the outwardly direction of panels 110, as indicated by arrow *t*. Continued rotation of pinion 120 results in gear 116 riding off control pinion 120, over its left edge. This action safely disengages the slug gears (116) at the end of their "outwards" stroke. Release of knob 137 again returns the pinion to its tilt-off position of FIG. 3. Turning the fine tune knob C.W. shifts the pinion to the left of its FIG. 9 C.C.W. position, as seen in FIG. 6. Gears 116 at their outward stroke end are nevertheless engaged by the pinion of an inwards displacement upon C.W. rotation of knob 137. Similarly, gears at their inward stroke end are reengaged when the C.C.W. control mode is used.

FIG. 12 is a perspective view of cam means 28, with forward projection 139 purposely deleted so as not to obscure the internal shape of the V-shaped cam surface. The V-shaped opening into which cam follower end 121' projects is of a variable depth, consistent with the cross-sectional views, as for example shown in FIGS. 4 and 5. Thus, in the normal rest position (of FIGS. 3–5) wherein cam follower end 121' is located at the apex of the V-shaped cam slot, it will project into said cam slot by the distance indicated as arrow B.

When it is desired to move slug 119 inward, the fine tuning controls are as shown in FIGS. 6–8, wherein cam follower end 121' will now be located in the deepest region 142 of the cam slot, with the depth thereof being indicated by arrow A. Continued rotation of the control pinion 120 moves slug 115 inward, with the length of gear members 116, 120 being interrelated to the depth of the cam slot, such that spur gear 116 will ride off the edge of pinion 120 at the end of its inward stroke.

Although the present invention has been illustrated with exemplary embodiments, it is to be understood that variations and modifications thereof may be made by those skilled in the art, that fall within the broader spirit and scope of the invention, as set forth in the following claims.

The embodiments of the invention in which an exclusive privilege or property is claimed are defined as follows.

1. A television tuner having a plurality of channel selection positions individually selectable through rotation of the channel selector shaft, coil arranged at each of said channel positions for tuning of the associated tuner channel circuitry, a slug for each of said coils arranged about the axis of said selector shaft and mounted for adjustable inductance coaction with its associated coil, said slugs being individually longitudinally displaceable, gear means affixed to each of said slugs at the exterior end thereof, a preset tuning shaft for individual adjusting the tuning position of said slugs with their respective coils, drive gear means engageable with the respective slug gear means of the coil positioned for the selected channel, said drive means being disposed and supported radially from said preset tuning shaft, and mechanism coupled to said preset tuning shaft for rotating said drive gear means and engaging it with the positioned slug gear means in either rotational direction and thereby controllably displace the slug of the positioned coil in either longitudinal direction, said mechanism including biasing means for normally holding said drive gear means disengaged for said slug gear means while said tuning shaft is released, whereby the tuner channel circuits are held tuned corresponding to the slug positions preset through said tuning shaft and mechanism and channel selection by said selector shaft is unhindered, in which said mechanism includes a clutch coupled to said tuning shaft and a cam motivated by said clutch and containing a cam surface, a cam follower coupled to said drive gear means, said cam surface coactable with said cam follower to displace the cam follower and bring said drive gear means into driving engagement with said slug gear means against the biasing means upon rotation of said tuning shaft in either direction, said biasing means directly moving said cam follower to a position in said cam effecting said disengaged relationship upon release of said tuning shaft, said mechanism further including resilient means for axially displacing said cam follower into coaction with said cam surface, said cam surface being proportioned to axially position said drive gear means to permit the slug gear means to engage therefrom when its associated slug is at the end of its stroke in either direction.

2. A television tuner having a plurality of channel selection positions individually selectable through rotation of the channel selector shaft, an oscillator coil arranged at each of said channel positions for tuning of the associated tuner channel circuitry a slug for each of said coils arranged concentrically about the axis of said selector shaft and mounted for inductive coaction with its associated coil, said slugs being individually longitudinally displaceable within said coil along a path parallel to said selector shaft axis, a gear affixed to each of said slugs extending transversely thereof at the exterior end thereof perpendicularly to said axis, a preset tuning shaft concentric with said selector shaft for individually adjusting the fine tuning position of said slugs with their respective coils, a control pinion engageable with the respective slug gear of the coil positioned for the selected channel, said control pinion being disposed radially from said preset tuning shaft, and mechanism operated by said preset tuning shaft for rotating said control pinion and engaging it with the positioned slug gear in either rotational direction and thereby controllably displace the slug of the positioned coil in either longitudinal direction, said mechanism including biasing means for normally holding said control pinion from said slug gear while said tuning shaft is released, whereby the tuner channel circuits are held tuned corresponding to the slug positions preset through said tuning shaft and mechanism and channel selection by said selector shaft is unhindered thereby, in which said mechanism includes a slip clutch coupled to said tuning shaft and a cam motivated by said slip clutch and containing a cavity cam surface, a cam follower coactable with said cam surface and coupled with said control pinion, said cam surface being proportioned to displace the cam follower and bring said control pinion into driving engagement with said slug gear against the biasing means hold upon rotation of said tuning shaft in either direction, said biasing means directly moving said cam follower to a position in said cam effecting said disengaged relationship upon release of said tuning shaft, and resilient means for axially displacing said cam follower into coaction with said cam surface, said cam surface being proportioned to axially position said control pinion to permit the slug gear to disengage therefrom when its associated slug is at the end of its stroke in either direction and to reestablish engagement with such disengaged slug gear when operated in the opposite direction.

3. A television tuner having a plurality of channel selection positions individually selectable through rotation of the channel selector shaft, coil arranged at each of said channel positions for tuning of the associated tuner channel circuitry, a slug for each of said coils arranged about the axis of said selector shaft and mounted for adjustable inductance coaction with its associated coil, said slugs being individually longitudinally displaceable gear means affixed to each of said slugs at the exterior end thereof, a preset tuning shaft for individually adjusting the tuning position of said slugs with their respective coils, drive gear means engageable with the respective slug gear means of the coil positioned for the selected channel, and mechanism coupled to said preset tuning shaft for rotating said drive gear means and engaging it with the positioned slug gear means in either rotational direction and thereby controllably displace the slug of the positioned coil in either longitudinal direction, said mechanism including biasing means for normally holding said drive gear means disengaged for said slug gear means while said tuning shaft is released, whereby the tuner channel circuits are held tuned corresponding to the slug positions preset through said tuning shaft and mechanism and channel selection by said selector shaft is unhindered, said mechanism including a clutch coupled to said tuning shaft and a cam extending from said clutch and containing a cam surface, a cam follower coactable with said cam surface, and a member mounting said drive gear means in engageable relation with said slug gear means, said member being mounted on the tuner in movable relation, said cam follower extending from said member to the cam surface, said biasing means normally resiliently biasing said member outwardly with respect to said selector shaft and said cam follower to the neutral cam surface position, said cam surface being proportioned to displace the cam follower and bring said drive gear means into driving engagement with said slug gear means upon rotation of said tuning shaft in either direction.

References Cited by the Examiner

UNITED STATES PATENTS

| | | | |
|---|---|---|---|
| 3,058,075 | 10/1962 | Polley | 334—51 |
| 3,148,345 | 9/1964 | Moran | 334—51 |

HERMAN KARL SAALBACH, *Primary Examiner.*

ELI LIEBERMAN, *Examiner.*

R. F. HUNT, *Assistant Examiner.*